(12) United States Patent
Zheng et al.

(10) Patent No.: US 8,194,444 B2
(45) Date of Patent: *Jun. 5, 2012

(54) SPIN-TRANSFER TORQUE MEMORY SELF-REFERENCE READ METHOD

(75) Inventors: Yuankai Zheng, Bloomington, MN (US); Yiran Chen, CN, MN (US); Xiaobin Wang, Savage, MN (US); Zheng Gao, Savage, MN (US); Dimitar V. Dimitrov, Edina, MN (US); Wenzhong Zhu, Apple Valley, MN (US); Yong Lu, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/968,441

(22) Filed: Dec. 15, 2010

(65) Prior Publication Data

US 2011/0085373 A1 Apr. 14, 2011

Related U.S. Application Data

(63) Continuation of application No. 12/390,006, filed on Feb. 20, 2009, now Pat. No. 7,876,604.

(60) Provisional application No. 61/111,354, filed on Nov. 5, 2008.

(51) Int. Cl.
*G11C 11/14* (2006.01)
*G11C 11/00* (2006.01)
*G11C 7/00* (2006.01)
*G11C 7/02* (2006.01)

(52) U.S. Cl. ............... 365/171; 365/158; 365/189.15; 365/209

(58) Field of Classification Search ............ 365/158, 365/189.15, 209
See application file for complete search history.

(56) References Cited

U.S. PATENT DOCUMENTS

| 6,317,356 | B1 | 11/2001 | Hoffmann |
| 6,870,760 | B2 | 3/2005 | Tsang |
| 7,102,946 | B2 | 9/2006 | Pelella |
| 7,123,505 | B2 | 10/2006 | Jeong |
| 7,170,782 | B2 | 1/2007 | Conley |
| 7,187,577 | B1 | 3/2007 | Wang |

(Continued)

FOREIGN PATENT DOCUMENTS

EP 1 553 601 7/2005

OTHER PUBLICATIONS

U.S. Appl. No. 12/147,723, filed Jun. 27, 2008, Li.

(Continued)

*Primary Examiner* — Ly D Pham
(74) *Attorney, Agent, or Firm* — Mueting Raasch & Gebhardt PA

(57) ABSTRACT

Self-reference reading a magnetic tunnel junction data cell methods are disclosed. An illustrative method includes applying a read voltage across a magnetic tunnel junction data cell and forming a read current. The magnetic tunnel junction data cell has a first resistance state. The read voltage is sufficient to switch the magnetic tunnel junction data cell resistance. The method includes detecting the read current and determining if the read current remains constant during the applying step. If the read current remains constant during the applying step, then the first resistance state of the magnetic tunnel junction data cell is the resistance state that the read voltage was sufficient to switch the magnetic tunnel junction data cell to.

20 Claims, 8 Drawing Sheets

U.S. PATENT DOCUMENTS

| | | | |
|---|---|---|---|
| 7,224,601 B2 | 5/2007 | Panchula | |
| 7,272,034 B1 | 9/2007 | Chen | |
| 7,272,035 B1 | 9/2007 | Chen | |
| 7,289,356 B2 | 10/2007 | Diao | |
| 7,345,912 B2 | 3/2008 | Luo | |
| 7,379,327 B2 | 5/2008 | Chen | |
| 7,502,249 B1 | 3/2009 | Ding | |
| 7,515,457 B2 | 4/2009 | Chen | |
| 7,876,604 B2 * | 1/2011 | Zheng et al. | 365/158 |
| 2006/0013039 A1 | 1/2006 | Braun | |
| 2006/0092734 A1 | 5/2006 | Tsuchida | |
| 2006/0098480 A1 * | 5/2006 | Bessho | 365/158 |
| 2006/0098498 A1 | 5/2006 | Jeong | |
| 2006/0114715 A1 | 6/2006 | Bessho | |
| 2006/0233018 A1 | 10/2006 | Tanizaki | |
| 2007/0014172 A1 | 1/2007 | Hidaka | |
| 2007/0246761 A1 | 10/2007 | Beach | |
| 2008/0310213 A1 | 12/2008 | Chen | |
| 2008/0310219 A1 | 12/2008 | Chen | |
| 2009/0040855 A1 | 2/2009 | Luo | |
| 2009/0103215 A1 | 4/2009 | Freitag | |
| 2009/0185410 A1 | 7/2009 | Huai | |

OTHER PUBLICATIONS

Hosomi et al., A Novel nonvolatile Memory with Spin Torque Transfer Magnetization Switching; Spin-RAM, 2005 IEEE.

PCT International Search Report and Written Opinion dated Jun. 8, 2010.

* cited by examiner ns read), limited endurance (~$10^3$-$10^4$ programming cycles), and the integration difficulty in system-on-chip (SoC). Flash memory (NAND or NOR) also faces significant scaling problems at 32 nm node and beyond.

SPIN-TRANSFER TORQUE MEMORY SELF-REFERENCE READ METHOD

CROSS-REFERENCE TO RELATED APPLICATIONS

This application claims the benefit of U.S. application Ser. No. 12/390,006 filed Feb. 20, 2009 and which is based off of Provisional Application No. 61/111,354 filed Nov. 5, 2008, the contents of which is hereby incorporated by reference in its entirety.

BACKGROUND

Fast growth of the pervasive computing and handheld/communication industry generates exploding demand for high capacity nonvolatile solid-state data storage devices. Flash memory is one such device but has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another candidate for nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes more severe.

Spin polarization current can be used to induce magnetization switching in MRAM designs. Spin-Torque Transfer RAM (STRAM), uses a (bidirectional) current through the MTJ to realize the resistance switching. The switching mechanism of STRAM is constrained locally and STRAM is believed to have a better scaling property than the conventional MRAM. However, reading a STRAM cell is challenging as the cell is scaled down.

BRIEF SUMMARY

The present disclosure relates to spin-transfer torque random access memory self-reference read operations and apparatus for the same. In particular, present disclosure relates to a spin-transfer torque random access memory self-reference read operation.

One illustrative method of reading a magnetic tunnel junction data cell includes applying a read voltage across a magnetic tunnel junction data cell and forming a read current. The magnetic tunnel junction data cell has a first resistance state. The read voltage is sufficient to switch the magnetic tunnel junction data cell resistance. The method includes detecting the read current and determining if the read current remains constant during the applying step. If the read current remains constant during the applying step, then the first resistance state of the magnetic tunnel junction data cell is the resistance state that the read voltage was sufficient to switch the magnetic tunnel junction data cell to.

Another illustrative method of self-reference reading a magnetic tunnel junction data cell includes applying a read current across a magnetic tunnel junction data cell and forming a read voltage. The magnetic tunnel junction data cell has a first resistance state. The read current is sufficient to switch the magnetic tunnel junction data cell resistance. The method includes detecting the read voltage and determining if the read voltage remains constant during the applying step. If the read voltage remains constant during the applying step, then the first resistance state of the magnetic tunnel junction data cell is the resistance state that the read current was sufficient to switch the magnetic tunnel junction data cell to.

Another embodiments includes a magnetic memory apparatus having a magnetic tunnel junction data cell that is switchable between a high resistance data state and a low resistance data state upon application of a spin polarized switching current and a switching current or voltage source electrically connected to the magnetic tunnel junction data cell. A voltage or current differentiator is electrically coupled to the magnetic tunnel junction data cell to detect a read current or read voltage change within a time interval of less than 50 nanoseconds when a switching current or voltage is applied to the magnetic tunnel junction data cell.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
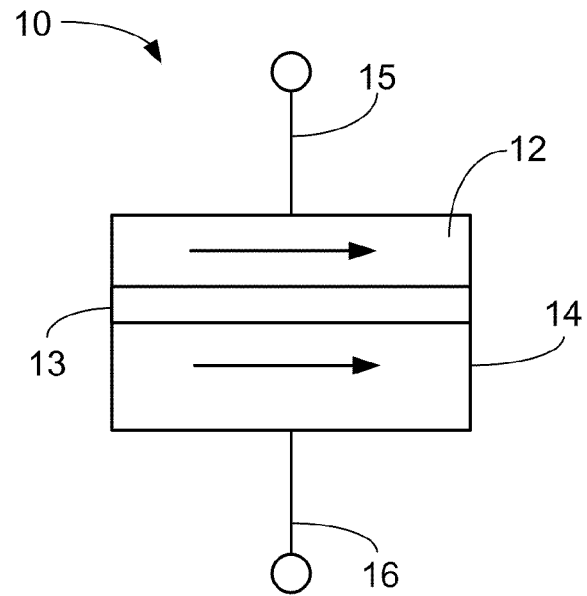
FIG. 1 is a cross-sectional schematic diagram of an illustrative spin-transfer torque MTJ memory unit in the low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque memory apparatus and self-reference read methods. In particular, present disclosure relates to self-reference reading methods to determine whether a spin-transfer torque memory unit has a high resistance state or low resistance state data state. In many embodiments, a read current or read voltage, sufficient to switch the resistance state of a magnetic tunnel junction data cell, is applied to a magnetic tunnel junction data cell. A resulting read voltage or current is detected and if a voltage or current jump or drop is detected, the resistance state of the magnetic tunnel junction data cell is determined to be the opposing data state that the read current or read voltage was sufficient to switch the magnetic tunnel junction to. If the resulting read current or resulting read voltage remains constant, then the resistance state of the magnetic tunnel junction data cell is determined to be the data state that the read current or read voltage was sufficient to switch the magnetic tunnel junction to. If a resulting read voltage or resulting read current jump or drop is detected, then a write back operation returns the magnetic tunnel junction data cell to its original resistive data state. The disclosed method provides a large available detection signal, and fast reading speed. While the present disclosure is not so limited, an appreciation of various aspects of the disclosure will be gained through a discussion of the examples provided below.

Figure 2:
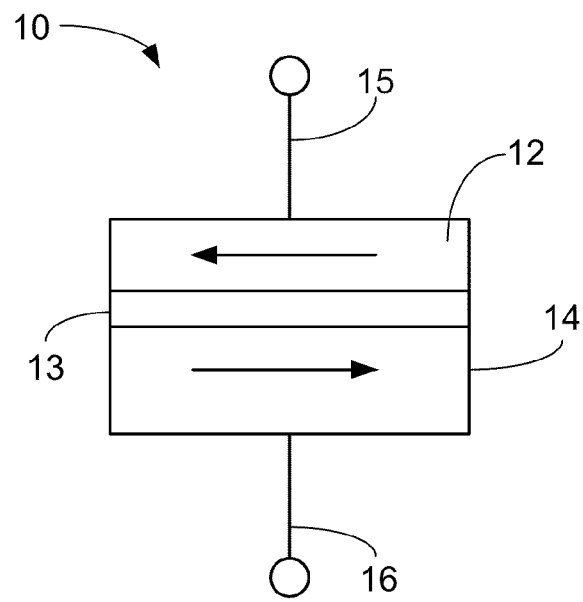
FIG. 2 is a cross-sectional schematic diagram of another spin-transfer torque MTJ memory unit in the high resistance state.

FIG. 1 is a cross-sectional schematic diagram of an illustrative spin-transfer torque MTJ memory unit 10 in the low resistance state and FIG. 2 is a cross-sectional schematic diagram of another spin-transfer torque MTJ memory unit 10 in the high resistance state. A magnetic tunnel junction (MTJ) memory unit 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the spin-transfer torque MTJ memory unit 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others. The reference magnetic layer 14 can be a single ferromagnetic layer, or may include multiple layers, for example, a pair of ferromagnetically coupled ferromagnetic layers, an antiferromagnetic pinning layer and a ferromagnetic pinned layer, a synthetic antiferromagnetic, or a synthetic antiferromagnetic with an antiferromagnetic layer.

FIG. 1 illustrates the spin-transfer torque MTJ memory unit 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the spin-transfer torque MTJ memory unit 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ memory unit 10 via spin-transfer occurs when a current, passing through a magnetic layer of the MTJ memory unit 10, becomes spin polarized and imparts a spin torque on the free layer 12 of the MTJ 10. When a sufficient spin torque is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the current.

The illustrative spin-transfer torque MTJ memory unit 10 may be used to construct a memory device that includes multiple MTJ memory units where a data bit is stored in spin-transfer torque MTJ memory unit by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ memory unit 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
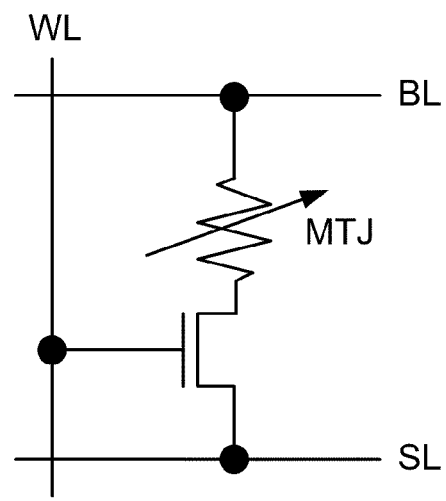
FIG. 3 is a schematic circuit diagram of a spin-transfer torque MTJ memory unit.

FIG. 3 is a schematic diagram of an illustrative spin-transfer torque MTJ memory unit MTJ. The spin-transfer torque MTJ memory unit MTJ is electrically connected in series to a transistor such as, for example, a NMOS transistor. The opposing side of the spin-transfer torque MTJ memory unit MTJ is electrically connected to a bit line BL. The transistor is electrically coupled to a source line SL and a word line WL. The MTJ can be modeled as a variable resistor in circuit schematic, as shown in FIG. 3.

Figure 4:
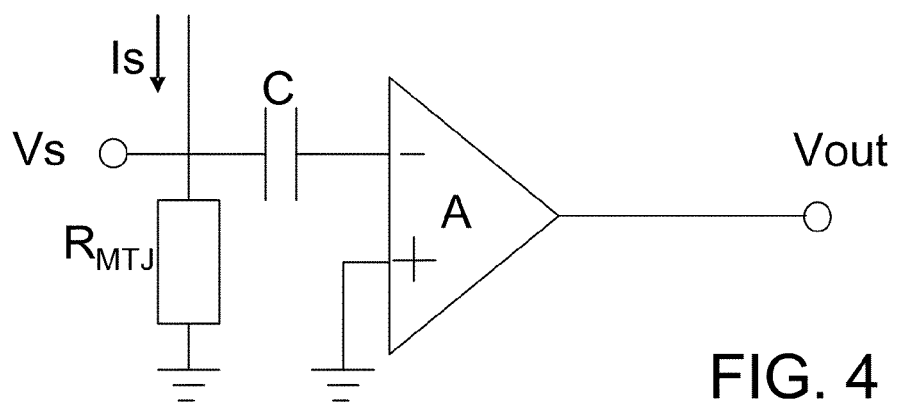
FIG. 4 is a schematic circuit diagram of an illustrative spin-transfer torque MTJ memory read detection apparatus.

FIG. 4 is a schematic circuit diagram of an illustrative spin-transfer torque MTJ memory apparatus to detect a voltage (or current) jump or drop during the read operation described herein. The detection circuit can be described as a differentiator. The magnetic tunnel junction data cell $R_{MTJ}$ (as described above) is electrically connected to a current source $I_S$ (or voltage source Vs) and a capacitor C is electrically between the magnetic tunnel junction data cell $R_{MTJ}$ and a sense amplifier A. The sense amplifier A provides a voltage output $V_{OUT}$. Any voltage change can be detected by the differentiator. An illustrative detailed signal is shown in FIG. 5.

Figure 5:
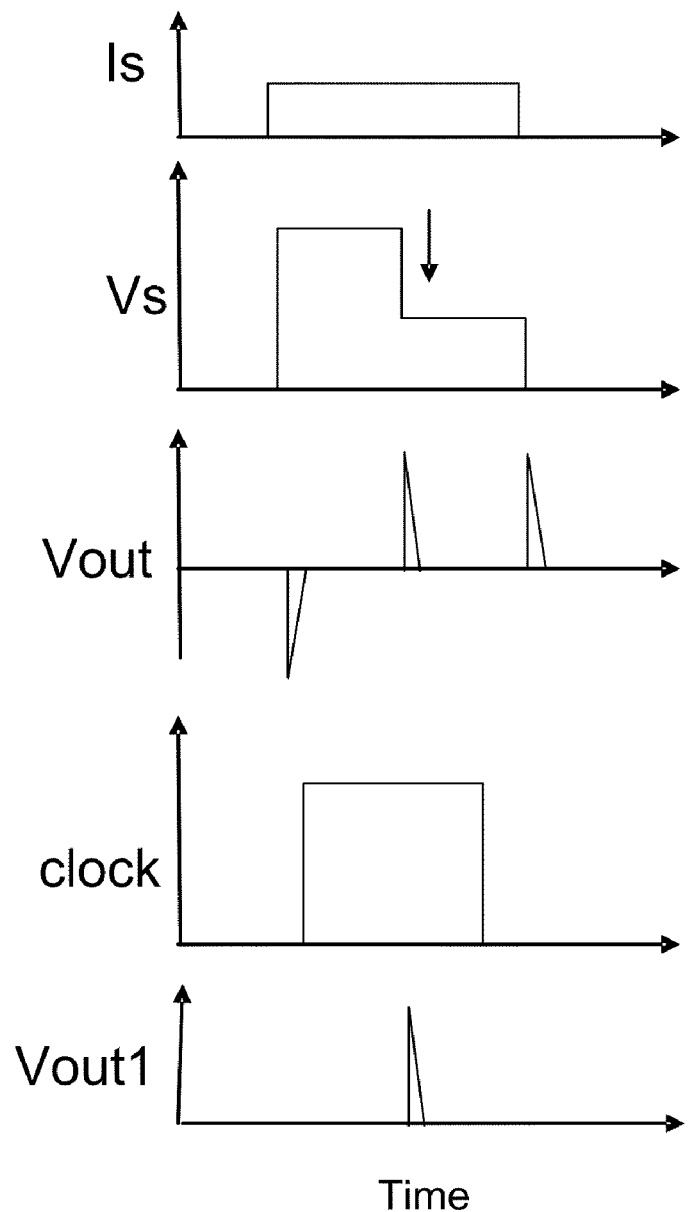
FIG. 5 is an illustrative detailed signal timing graphs for the read detection apparatus shown in FIG. 5.

FIG. 5 illustrates application of a constant current source $I_S$ and a corresponding resulting voltage drop $V_S$. The voltage output $V_{OUT}$ show three voltage spikes. A clock CLOCK is utilized to remove the unwanted initial and final voltage spikes (at the start and end of the signal detection). The resulting voltage output $V_{OUT1}$ indicates a voltage drop due to the magnetic tunnel junction data cell $R_{MTJ}$ switching resistance states (from the high resistance state to the low resistance state in this example). Thus, the read operation indicates that the magnetic tunnel junction data cell $R_{MTJ}$ was in the high resistance state. A write back operation can then be performed to return the magnetic tunnel junction data cell $R_{MTJ}$ to the original high resistance state.

Figure 6:
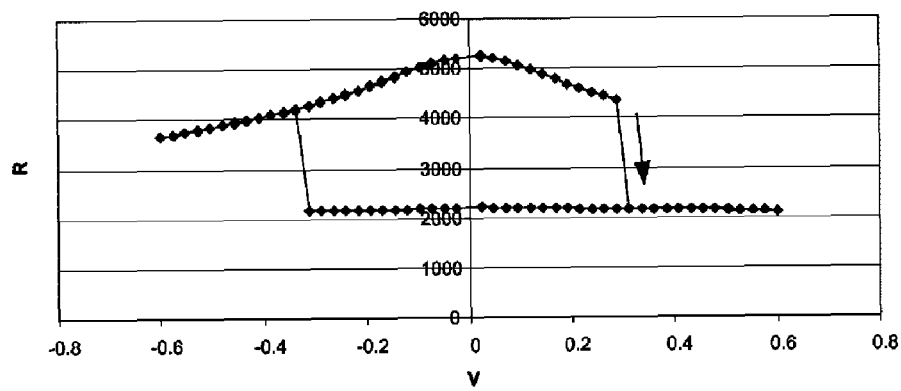
FIG. 6 is a is a graph of a static R-V (resistance-voltage) curve of a spin-transfer torque MTJ memory unit where the resistance state switches from the high resistance state to the low resistance state.

FIG. 6 is a is a graph of a static R-V (resistance-voltage) curve of a spin-transfer torque MTJ memory unit where the resistance state switches from the high resistance state to the low resistance state. When applying a positive voltage on the second electrode 16 in FIG. 1 or 2, the MTJ 10 enters the positive applied voltage region in FIG. 6 and switches from the high resistance state (FIG. 2) to the low resistance state (FIG. 1). When applying a positive voltage on the first electrode 15 in FIG. 1 or 2, the MTJ 10 enters the negative applied voltage region in FIG. 6. The resistance of the MTJ switches from the low resistance state (FIG. 1) to the high resistance state (FIG. 2).

Figure 7:
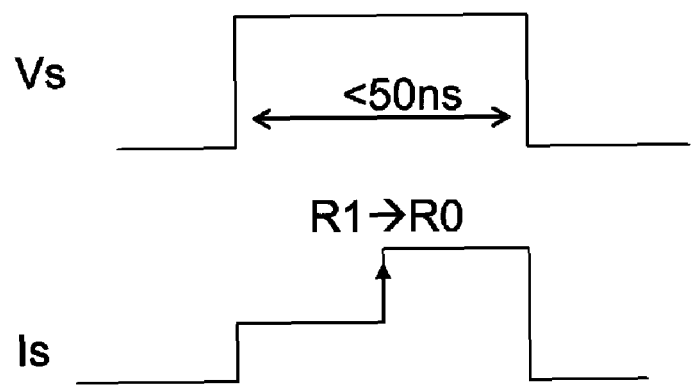
FIG. 7 is illustrative detailed signal timing graphs for read current detection at the high to low resistance state switching voltage when the spin-transfer torque MTJ memory unit is in the high resistance state.
Figure 8:
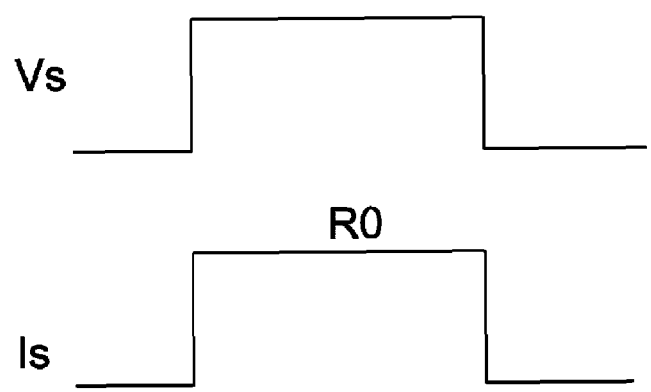
FIG. 8 is illustrative detailed signal timing graphs for read current detection at the high to low resistance state switching voltage when the spin-transfer torque MTJ memory unit is in the low resistance state.

FIG. 7 is illustrative detailed signal timing graphs for read current detection at the high to low resistance state switching voltage when the spin-transfer torque MTJ memory unit is in the high resistance state. FIG. 8 is illustrative detailed signal timing graphs for read current detection at the high to low resistance state switching voltage when the spin-transfer torque MTJ memory unit is in the low resistance state.

A read voltage Vs is applied across the magnetic tunnel junction data cell or spin-transfer torque MTJ memory unit. The read voltage Vs is equal to or greater than the critical voltage that is sufficient to switch the data resistance state of the magnetic tunnel junction data cell (from the high to the low resistance state in this example). The read voltage Vs is applied for a time duration of 0.1 to 50 nanoseconds, or from 0.1 to 25 nanoseconds, or from 01. to 10 nanoseconds. Thus the read operation is a high speed operation. During the voltage pulse, the resulting (or sensed) read current Is passing though the magnetic tunnel junction data cell is detected, as illustrated in FIG. 7 and FIG. 8. FIG. 7 illustrates the magnetic tunnel junction data cell in the high resistance state R1 and switching to the low resistance state R0. A sensed read current Is jump (increase) occurs during the read operation. FIG. 8 illustrates the magnetic tunnel junction data cell in the low resistance state R0. A sensed read current Is remains constant during the read operation. In other embodiments, the read voltage is equal to or greater than the critical voltage that is sufficient to switch the data resistance state of the magnetic tunnel junction data cell from the low to the high resistance state.

Figure 9:
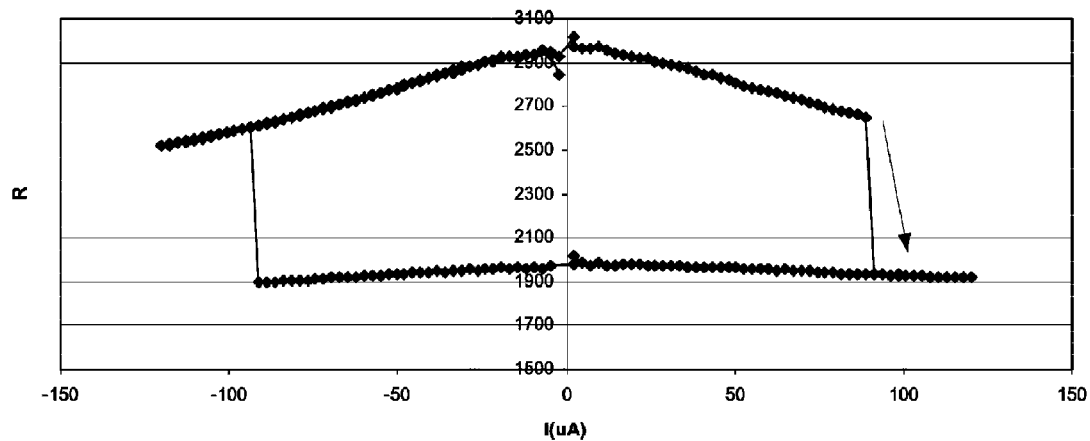
FIG. 9 is a is a graph of a static R-I (resistance-current) curve of a spin-transfer torque MTJ memory unit where the resistance state switches from the high resistance state to the low resistance state.
Figure 10:
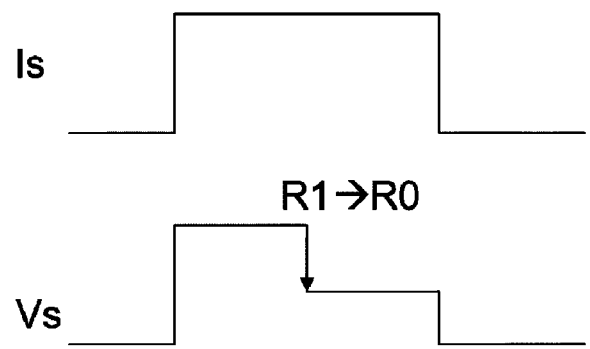
FIG. 10 is illustrative detailed signal timing graphs for read current detection at the high to low resistance state switching voltage when the spin-transfer torque MTJ memory unit is in the high resistance state.
Figure 11:
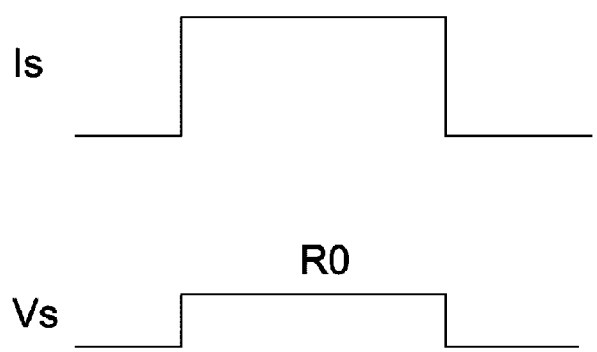
FIG. 11 is illustrative detailed signal timing graphs for read current detection at the high to low resistance state switching voltage when the spin-transfer torque MTJ memory unit is in the low resistance state.

FIG. 9 is a is a graph of a static R-I (resistance-current) curve of a spin-transfer torque MTJ memory unit where the resistance state switches from the high resistance state to the low resistance state. FIG. 10 is illustrative detailed signal timing graphs for read voltage detection at the high to low resistance state switching current when the spin-transfer torque MTJ memory unit is in the high resistance state. FIG. 11 is illustrative detailed signal timing graphs for read voltage detection at the high to low resistance state switching current when the spin-transfer torque MTJ memory unit is in the low resistance state.

A read current Is is applied across the magnetic tunnel junction data cell or spin-transfer torque MTJ memory unit. The read current Is is equal to or greater than the critical current that is sufficient to switch the data resistance state of the magnetic tunnel junction data cell (from the high to the low resistance state in this example). The read current Is is applied for a time duration of 0.1 to 50 nanoseconds, or from 0.1 to 25 nanoseconds, or from 0.1 to 10 nanoseconds. Thus the read operation is a high speed operation. During the current pulse, the resulting (or sensed) read voltage Vs passing though the magnetic tunnel junction data cell is detected, as illustrated in FIG. 10 and FIG. 11. FIG. 10 illustrates the magnetic tunnel junction data cell in the high resistance state R1 and switching to the low resistance state R0. A sensed read voltage Vs drop (decrease) occurs during the read operation. In many embodiments the voltage change can be 100 mV or more. FIG. 11 illustrates the magnetic tunnel junction data cell in the low resistance state R0. A sensed read voltage Vs remains constant during the read operation. In other embodiments, the read current is equal to or greater than the critical current that is sufficient to switch the data resistance state of the magnetic tunnel junction data cell from the low to the high resistance state.

Figure 12A:
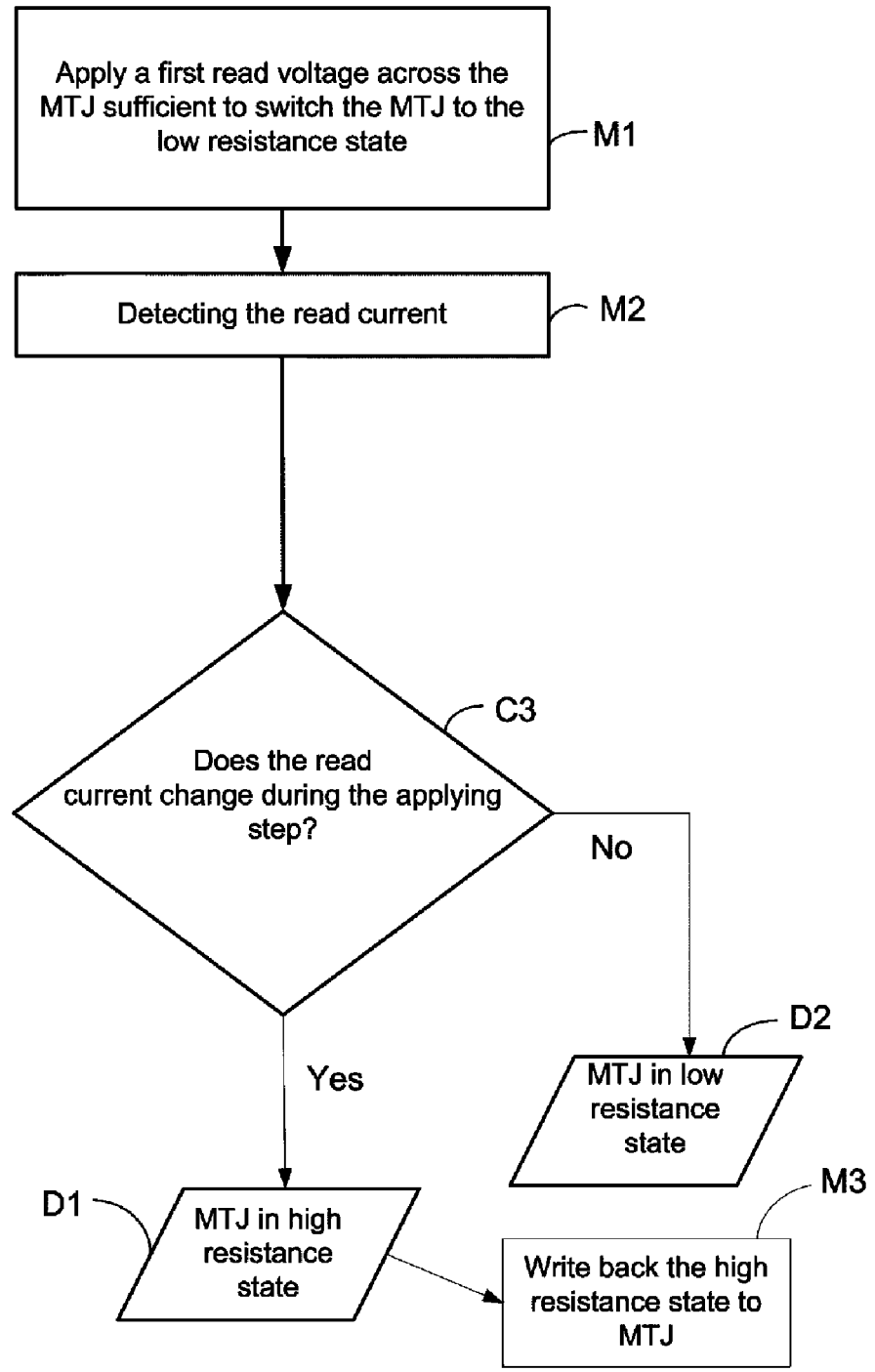
FIG. 12A is a flow diagram of an illustrative self-reference reading method sensing a read current when applying a voltage sufficient to switch the MTJ from a high resistance state to a low resistance state.

FIG. 12A is a flow diagram of an illustrative self-reference reading method sensing a read current when applying a voltage sufficient to switch the MTJ from a high resistance state to a low resistance state. The method includes applying a read voltage across a magnetic tunnel junction data cell and forming a read current at block M1. The magnetic tunnel junction data cell having a first resistance state and the read voltage is sufficient to switch the magnetic tunnel junction data cell resistance (from the high to the low resistance state, in this example). At block M2 the read current is detected. Then the method includes determining if the read current remains constant during the applying step at block C3. If the read current remains constant during the applying step, then the first resistance state of the magnetic tunnel junction data cell is the resistance state that the read voltage was sufficient to switch the magnetic tunnel junction data cell to (the low resistance state, in this example) at block D2. If the read current changes (increases, in this example) the first resistance state is the opposing resistance state (the high resistance state, in this example) at block D1 and the high resistance state is written back to the magnetic tunnel junction data cell at block M3.

Figure 12B:
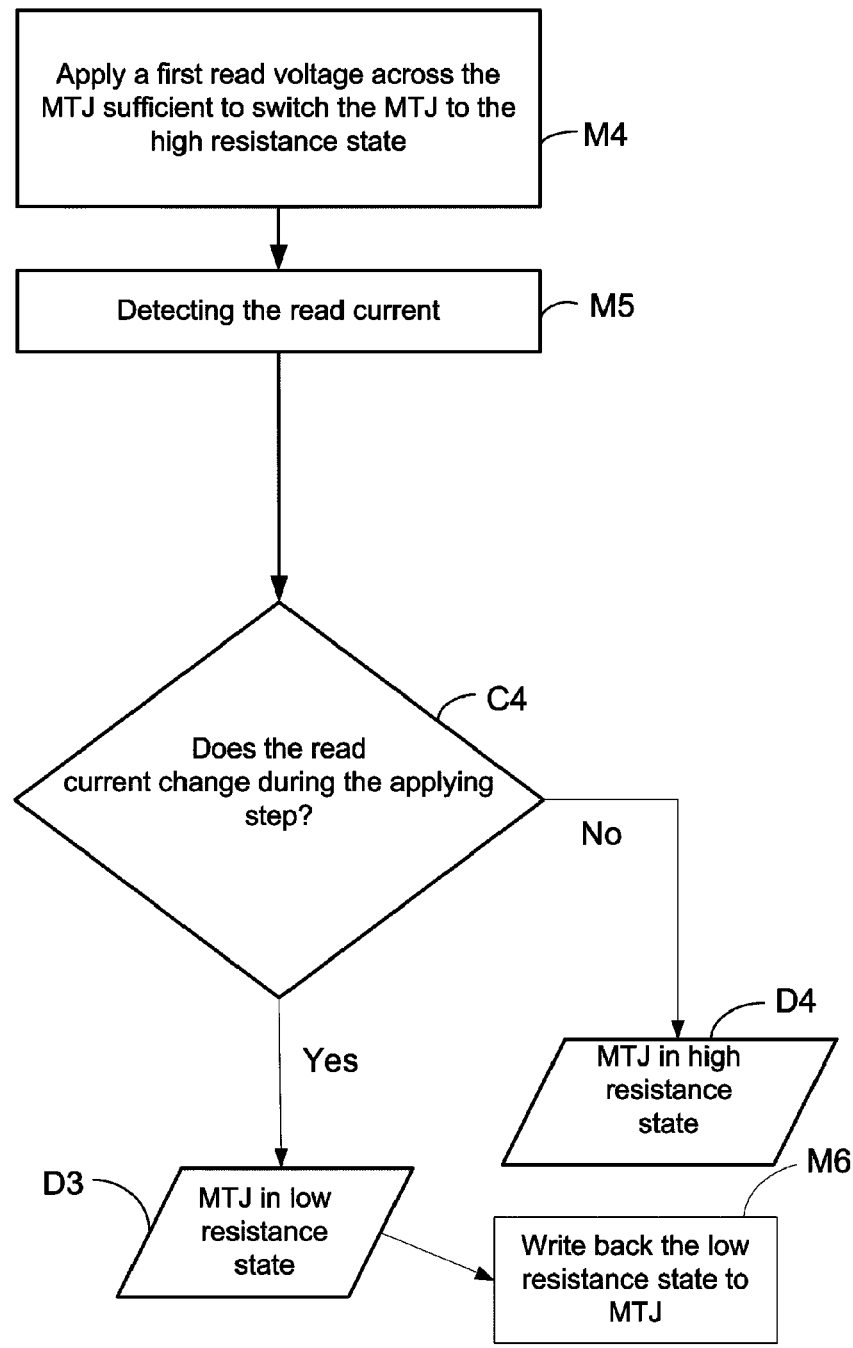
FIG. 12B is a flow diagram of an illustrative self-reference reading method sensing a read current when applying a voltage sufficient to switch the MTJ from a low resistance state to a high resistance state.

FIG. 12B is a flow diagram of an illustrative self-reference reading method sensing a read current when applying a voltage sufficient to switch the MTJ from a low resistance state to a high resistance state. The method includes applying a read voltage across a magnetic tunnel junction data cell and forming a read current at block M4. The magnetic tunnel junction data cell having a first resistance state and the read voltage is sufficient to switch the magnetic tunnel junction data cell resistance (from the low to the high resistance state, in this example). At block M5 the read current is detected. Then the method includes determining if the read current remains constant during the applying step at block C4. If the read current remains constant during the applying step, then the first resistance state of the magnetic tunnel junction data cell is the resistance state that the read voltage was sufficient to switch the magnetic tunnel junction data cell to (the high resistance state, in this example) at block D4. If the read current changes (increases, in this example) the first resistance state is the opposing resistance state (the high resistance state, in this example) at block D3 and the low resistance state is written back to the magnetic tunnel junction data cell at block M6.

Figure 13:
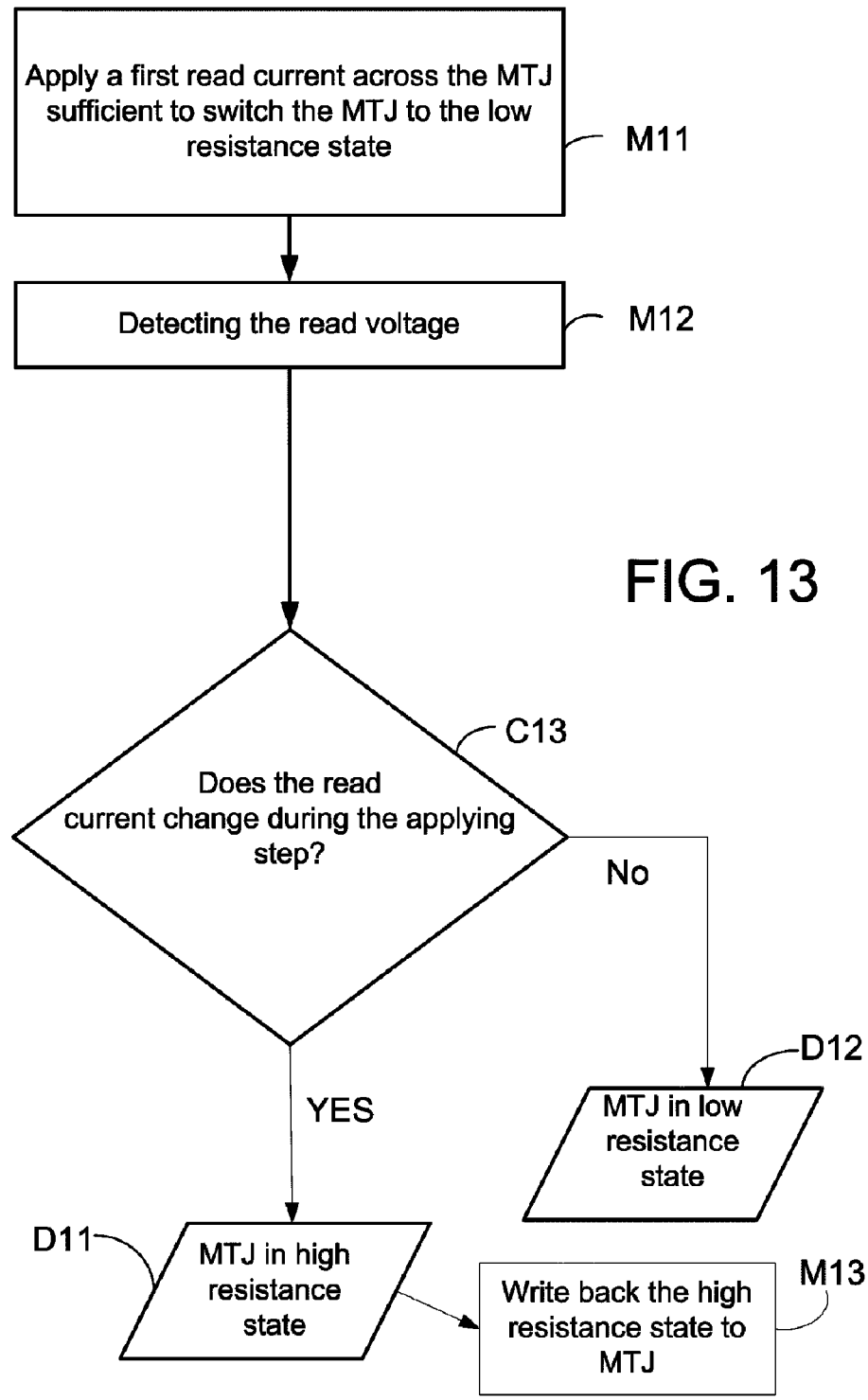
FIG. 13 is a flow diagram of an illustrative self-reference reading method sensing a read voltage.

FIG. 13 is a flow diagram of an illustrative self-reference reading method sensing a read voltage. The method includes applying a read current across a magnetic tunnel junction data cell and forming a read voltage at block M11. The magnetic tunnel junction data cell having a first resistance state and the read current is sufficient to switch the magnetic tunnel junction data cell resistance (from the high to the low resistance state, in this example). At block M12 the read voltage is detected. Then the method includes determining if the read voltage remains constant during the applying step at block C13. If the read voltage remains constant during the applying step, then the first resistance state of the magnetic tunnel junction data cell is the resistance state that the read current was sufficient to switch the magnetic tunnel junction data cell to (the low resistance state, in this example) at block D12. Otherwise the first resistance state is the opposing resistance state (the high resistance state, in this example) at block D11 and the high resistance state is written back to the magnetic tunnel junction data cell at block M13.

In other embodiments, the read current is sufficient to switch the magnetic tunnel junction data cell resistance from the low to the high resistance state. In these embodiments, if the read voltage remains constant during the applying step, then the first resistance state of the magnetic tunnel junction data cell is the low resistance state. If the read voltage does not remain constant or changes (increases in this example) the first resistance state is the opposing resistance state (the high resistance state, in this example) and the high resistance state is written back to the magnetic tunnel junction data cell at block.

Thus, embodiments of the SPIN-TRANSFER TORQUE MEMORY SELF-REFERENCE READ METHOD are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of self-reference reading a magnetic tunnel junction data cell, comprising:
    applying a read voltage across a magnetic tunnel junction data cell and forming a read current, the magnetic tunnel junction data cell having a first resistance state, the read voltage being sufficient to switch the magnetic tunnel junction data cell resistance;
    detecting the read current; and
    determining the resistance state of the magnetic tunnel junction data cell, wherein
        if the read current remains constant during the applying step, then the first resistance state of the magnetic tunnel junction data cell is the resistance state that the read voltage was sufficient to switch the magnetic tunnel junction data cell to, and
        if the read current changes during the applying step, then the first resistance state of the magnetic tunnel junction data cell is a second resistance state.

2. A method according to claim 1, wherein the applying step has a time duration in a range from 0.1 to 50 nanoseconds.

3. A method according to claim 1, wherein the applying step has a time duration in a range from 0.1 to 25 nanoseconds.

4. A method according to claim 1, wherein the read voltage is sufficient to switch the magnetic tunnel junction data cell from a high resistance state to a low resistance state, and the first resistance state is the low resistance state and the second resistance state is the high resistance state.

5. A method according to claim 1, wherein the read voltage is sufficient to switch the magnetic tunnel junction data cell from a low resistance state to a high resistance state, and the first resistance state is the high resistance state and the second resistance state is the low resistance state.

6. A method according to claim 1, further comprising determining if the read current increases during the applying step, and if the read current increases during the applying step the first resistance state of the magnetic tunnel junction data cell is a high resistance state and the second resistance state is the low resistance state.

7. A method according to claim 6, further comprising writing back the high resistance state to the magnetic tunnel junction data cell.

8. A method according to claim 1, further comprising determining if the read current decreases during the applying step, and if the read current decreases during the applying step the first resistance state of the magnetic tunnel junction data cell is a low resistance state and the second resistance state is a high resistance state.

9. A method according to claim 8, further comprising writing back the low resistance state to the magnetic tunnel junction data cell.

10. A method according to claim 1, wherein the magnetic tunnel junction data cell is a spin-transfer torque magnetic tunnel junction data cell.

11. A method of self-reference reading a magnetic tunnel junction data cell, comprising:
    applying a read current across a magnetic tunnel junction data cell and forming a read voltage, the magnetic tunnel junction data cell having a first resistance state, the read current being sufficient to switch the magnetic tunnel junction data cell resistance;

detecting the read voltage; and determining if the read voltage remains constant during the applying step, wherein if the read voltage remains constant during the applying step, then the first resistance state of the magnetic tunnel junction data cell is the resistance state that the read current was sufficient to switch the magnetic tunnel junction data cell to, and if the read voltage changes during the applying step, then the first resistance state of the magnetic tunnel junction data cell is a second resistance state.

12. A method according to claim 11, wherein the applying step has a time duration in a range from 0.1 to 50 nanoseconds.

13. A method according to claim 11, wherein the read current is sufficient to switch the magnetic tunnel junction data cell from a high resistance state to a low resistance state, and the first resistance state is the low resistance state and the second resistance state is the high resistance state.

14. A method according to claim 11, wherein the read current is sufficient to switch the magnetic tunnel junction data cell from a low resistance state to a high resistance state, and the first resistance state is the high resistance state and the second resistance state is the low resistance state.

15. A method according to claim 11, further comprising determining if the read voltage decreases during the applying step, and if the read voltage decreases during the applying step the first resistance state of the magnetic tunnel junction data cell is a high resistance state and the second resistance state is a low resistance state.

16. A method according to claim 15, wherein the read voltage decreases by more than 100 mV.

17. A method according to claim 15, further comprising writing back the high resistance state to the magnetic tunnel junction data cell.

18. A method according to claim 11, further comprising determining if the read voltage increases during the applying step, and if the read voltage increases during the applying step the first resistance state of the magnetic tunnel junction data cell is a low resistance state and the second resistance state is the high resistance state.

19. A method according to claim 18, further comprising writing back the low resistance state to the magnetic tunnel junction data cell.

20. A method according to claim 11, wherein the magnetic tunnel junction data cell is a spin-transfer torque magnetic tunnel junction data cell.

\* \* \* \* \*